(12) United States Patent
Wu et al.

(10) Patent No.: US 7,228,468 B2
(45) Date of Patent: Jun. 5, 2007

(54) METHOD AND APPARATUS OF BUILD-IN SELF-DIAGNOSIS AND REPAIR IN A MEMORY WITH SYNDROME IDENTIFICATION

(75) Inventors: Cheng-Wen Wu, Hsinchu (TW); Rei-Fu Huang, Sinhua Township, Tainan County (TW); Chin-Lung Su, Taipei (TW); Wen-Ching Wu, Jhudong Township, Hsinchu County (TW); Yeong-Jar Chang, Taiping (TW); Kun-Lun Luo, Hsinchu (TW); Shen-Tien Lin, Houli Township, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 200 days.

(21) Appl. No.: 11/001,345

(22) Filed: Nov. 30, 2004

(65) Prior Publication Data

US 2006/0064618 A1 Mar. 23, 2006

(30) Foreign Application Priority Data

Sep. 17, 2004 (TW) .............................. 93128298 A

(51) Int. Cl.
*G11C 29/00* (2006.01)
(52) U.S. Cl. .................... 714/710; 714/718; 714/723; 714/7; 714/8; 365/201
(58) Field of Classification Search .................. None
See application file for complete search history.

(56) References Cited

U.S. PATENT DOCUMENTS

| | | | | |
|---|---|---|---|---|
| 6,026,505 A * | 2/2000 | Hedberg et al. | ............ | 714/711 |
| 6,373,758 B1 * | 4/2002 | Hughes et al. | .............. | 365/200 |
| 6,408,401 B1 * | 6/2002 | Bhavsar et al. | ................ | 714/7 |
| 6,574,757 B1 * | 6/2003 | Park et al. | ................... | 714/710 |
| 6,907,554 B2 * | 6/2005 | Adams et al. | .............. | 714/718 |
| 2003/0115518 A1 * | 6/2003 | Kleveland et al. | .......... | 714/718 |
| 2004/0210803 A1 * | 10/2004 | Cheng et al. | ............... | 714/710 |
| 2004/0225912 A1 * | 11/2004 | Ronza et al. | .................. | 714/5 |

OTHER PUBLICATIONS

Jin-Fu Li et al., "A Built-In Self-Repair Scheme for Semiconductor Memories with 2-D Redundancy", Sep. 30-Oct. 2, 2003, IEEE International Test Conference, pp. 393-402.*

(Continued)

*Primary Examiner*—Albert Decady
*Assistant Examiner*—John P. Trimmings

(57) ABSTRACT

The present invention provides a method and apparatus for a memory build-in self-diagnosis and repair with syndrome identification. It uses a fail-pattern identification and a syndrome-format structure to identify faulty rows, faulty columns and single faulty word in the memory during the testing process, then exports the syndrome information. Based on the syndrome information, a redundancy analysis algorithm is applied to allocate the spare memory elements repairing the faulty memory cells. It has a sequencer with enhanced fault syndrome identification, a build-in redundancy-analysis circuit with improved redundancy utilization, and an address reconfigurable circuit with reduced timing penalty during normal access. The invention reduces the occupation time and the required capture memory space in the automatic test equipment. It also increases the repair rate and reduces the required area overhead.

19 Claims, 12 Drawing Sheets

OTHER PUBLICATIONS

Chih-Hsien Hsu, "Novel-Fault-Tolerant Techniques for High Capacity RAMs", IEEE, Dependable Computing Procedings, 2001, Dec. 19, 2001, pp. 11-18.*

Jin-Fu Li et al., "Using Syndrome Compression for Memory Built-In Self-Diagnosis", IEEE Technology Systems and Applications Proceedings 2001, Apr. 20, 2001, pp. 303-306.*

John T Chen, Jitendra Khare, Ken Walker, Saghir Shaikh, Janusz Rajski and Wojciech Maly, "Test Response Compression and Bitmap Encoding for Embedded Memories in Manufacturing Process Monitoring", ITC International Test Conference, P258-P267.

Jin-Fu Li, Jen-Chieh Yeh, Rei-Fu Huang and Cheng-Wen Wu, Peir-Yuan Tsai, Archer Hsu, and Eugene Chow " A Built-In Self-Repair Scheme for Semiconductor Memories with 2-D Redundancy", ITC International Test Conference, P393-P402.

Tomoya Kawagoe, Jun Ohtani, Mitsutaka Niiro, Tukasa Ooishi, Mitsuhiro Hamada and Hideto Hidaka, "A Built-In Self-Repair Analyzer (CRESTA) for embedded DRAMs", Manufacturing Technology & Production Management Div., Mitsubishi Electric Corp., 4-1 Mizuhara, Itami, Hyogo,664-8641, Japan.

Rei-Fu Huang, Chin-Lung Su and Cheng-Wen Wu, Yeong-Jar Chang and Wen-Ching Wu, "A Memory Built-in Self-Diagnosis Design With Syndrome Compression", 2004 IEEE International Workshop on Current & Defect Based Testing (DBT 2004), P1~P6.

* cited by examiner

FIG. 5a

| session | address | word syndrome | conventional syndrome format

FIG. 5b

| 00 | session | address | compressed word syndrome | single-faulty-word syndrome format

| 11 | session | address | end column | faulty-row syndrome format

| 01 | session | address | end row | compressed word syndrome | faulty-column syndrome format

| percentages of the fault | c:60% r:20% | c:10% r:10% | c:0% r:40% | c:40% r:0% | c:0% r:0% |
|---|---|---|---|---|---|
| conventional method | 74.5% | 78.1% | 145% | 72.0% | 70.5% |
| invention | 0.27% | 2.37% | 6.327% | 0.44% | 76.5% |

FIG. 11

| memory size | gate count | area overhead |
|---|---|---|
| 8K×16 | 3366 | 3.53% |
| 4K×32 | 4387 | 4.61% |
| 8K×64 | 6569 | 2.11% |

FIG. 12

|  | conventional method | row-first | column-first | small-bitmap | invention |
|---|---|---|---|---|---|
| number of spare elements | (4,8) | (4,8) | (4,8) | (4,8) | (4,4) |
| area overhead of the BISR | 5.6K | 4.8K | 4.8K | 7.6K | 8.9K |

FIG. 13

METHOD AND APPARATUS OF BUILD-IN SELF-DIAGNOSIS AND REPAIR IN A MEMORY WITH SYNDROME IDENTIFICATION

FIELD OF THE INVENTION

The present invention generally relates to syndrome identification for a memory testing, and more specifically to a build-in self-diagnosis and repair (BISD/R) method and apparatus in a memory with syndrome identification.

BACKGROUND OF THE INVENTION

With the advent of technology, the size and working speed of memory core have increased dramatically in today's integrated circuits, and the integration of system-on-chip (SOC) becomes more and more popular. As the SOC design grows, demand for embedded memory also increases. The memory core in the SOC design normally has larger area than other cores, and its density is also higher than that of logic cores. Therefore, the memory yield often dominates the yield of an SOC chip. SOC chips usually have poor yield. An efficient method for improving the SOC yield is increasing the memory yield.

To improve the memory yield, efficient diagnosis and repair schemes are needed. The diagnosis scheme can detect the weakness of product and then modify design or process, and the repair scheme can replace the faulty cell with spare memory. Both of them can enhance the yield of memory cores. Embedded memory cores are widely used in SOC applications but they cannot be easily accessed from external circuitry. So these schemes should be realizable in circuit with acceptable area overhead. In other word, the area overhead of the built-in self-diagnosis (BISD) or built-in self-repair (BISR) should be low to reduce area penalty.

Testing of embedded memory is normally done by built-in self-test (BIST). A BIST scheme that also collects and exports the diagnostic data for subsequent on-line or off-line analysis has been called a BISD scheme. The exported diagnostic data can be used to, e.g., construct the bit-maps, identify the failure modes, repair the faulty cells, etc.

Frequently, the volume of diagnostic data of faulty memory cores is too large to be stored in the automatic test equipment (ATE), due to very Limited space of the capture memory in a typical ATE. A solution to this problem is compression of diagnostic data Recently, there are memory researches focusing on this subject. Some researchers define several frequently seen fail patterns, and compress the bit-maps based on these fail patterns. If the bit-maps relate to large memories, they are frequently compressed with fail patterns. The compression of output response from the BIST circuit can be found in the literature. The method is similar to signature analysis in logic BIST.

Fault-syndrome compression approaches have been proposed recently, where a partial Huffman-tree and other techniques are used to improve the compression ratio while maintaining a low BISD hardware cost.

FIG. 1 is a block diagram of a conventional BIST/BISD architecture that comprises three blocks, a controller 101, a sequencer 103 and a test pattern generator (TPG) 105. The controller 101 is the interface between the BIST/D and ATE. The sequencer 103 has a finite state machine (FSM), and is the main part of the BIST/D design. It controls the TPG 105 executing the test commands from the controller 101, and is also responsible for shifting out the fault syndromes. The TPG 105 has two main functions—decoding the test commands sent from the sequencer 103 and comparing the memory output with the expected data. The TPG 105 is thus highly dependent on the memory specifications, especially on the memory timing parameters and access modes. In physical design, it should be placed as close to the memory as possible to avoid possible timing violations. The sequencer 103 also becomes a complex circuit block if the BIST/D supports fail-pattern identification scheme.

FIG. 1 shows the input/output (I/O) signals MCK, MSI, MBC, MBS, MBO, MRD, MBR, and MSO, which represent the memory BISD-clock, memory BISD-scan-in, memory BISD-control, memory BISD mode selection, memory BISD-output, memory BISD-ready, memory BISD-reset, and memory BISD-scan-out signals, respectively.

Referring to FIG. 1, the operation of I/O signals is further explained herein below. For a synchronous RAM, MCK is usually the same as the memory clock so that at-speed test can be performed. The MSI input is for scan in test commands to the programmable BISD. The MBC signal controls the finite state machine (FSM) of the controller 101. Whether the system is in normal mode or BIST/BISD mode is determined by MBS. MBO outputs the test results, indicating whether the memory is good (1) or bad (0). As soon as the test process finishes, MRD goes high, else it stays low. The MBR signal is an asynchronous reset signal. Finally, MSO is used to scan out the error information for diagnosis or redundancy repair.

Diagnosis can help designers understand the weakness of the product, and redundancy repair can increase the yield of the product. The BISR design is the trend of the embedded memory, and there are many researches on this subject. Among them, the infrastructure IPs (IIPs) have been applied for yield enhancement. A memory core with BISR design is an important IIP. A BISR design with comprehensive real-time exhaustive search test and analysis method has been published. There are many types of redundancy structures. Among them, the word redundancy repair scheme was proposed early.

Another example is using a power-on repair BISR design with spare columns (1-D redundancy) only. The 2-D redundancy structure with segment partition and heuristic redundancy analysis (RA) algorithm was also studied. The authors applied a static and dynamic data-bin repair scheme or an on-line BISR design with a transparent BIST algorithm for SRAMs.

These redundancy repair researches focus on different applications, and they stress the importance of the BISR design.

FIG. 2 shows a typical BISR design which comprises three main blocks, BIST 201, built-in redundancy-analysis (BIRA) 203, and address reconfiguration (AR) 205.

The BIST 201 detects faults in the memory and exports the fault syndrome to the BIRA 203. The fault coverage of the BIST 201 depends on the test algorithms it implements. The fault syndrome generated by the BIST 201 contains the address of the faulty cell or word. The BIRA 203 receives the fault syndrome from the BIST 201 and analyzes the information using a built-in redundancy analysis algorithm. The BIRA 203 has two major functions: RA and spare element configuration.

The redundancy analysis algorithm is the main part of the BISR design, and it usually has two phases, must-repair phase and final spare allocation phase. The phase-1, must-repair phase, is used to identify the faulty rows or columns that must be repaired by spare rows or columns. In the second phase, the remaining faulty cells are repaired by the available spare elements not used in phase-1. This is normally done by simple heuristics. Most of the remaining faults in phase-2 are single-cell faults, and most of them are orthogonal with each other. The RA algorithm should be easy to implement, and be cost effective. Although exhaustive-search RA algorithms generate optimal spare allocation results, they are costly to implement and thus impractical.

Selection of an appropriate RA algorithm is highly related to the number of spare elements and their structure. This can be efficiently evaluated by a simulator which reports the repair rates for different RA algorithms and spare element configurations. Based on the repair rates, users will be able to select the most cost effective one for using in the BISR implementation.

The AR circuit is used to 'repair' the memory, i.e., it replaces the faulty cells with the fault-free spare ones. This is normally done by address remapping or address decoder reconfiguration (by, e.g., switches or fuses). If there is a non-volatile memory on chip, it can be used to store the reconfiguration information even when the power is off. Alternatively, power-on BIST and BISR can be used.

The complexity of an AR circuit depends partly on the spare structure, i.e., structure of spare rows, columns, words, blocks, etc. The complexity increases with the number of spare elements. Another important issue in the AR circuit design is performance penalty because it affects the access time of the memory during normal operation. The performance penalty due to address reconfiguration should be as low as possible.

SUMMARY OF THE INVENTION

The present invention provides a novel BISD design and some efficient BISR designs based on fail-pattern identification. The BISD circuit of this invention incorporates a fault syndrome compression scheme and some efficient fail patterns (single faulty-word, faulty-row, and faulty-column) identification methods. Simulation results show that this invention effectively reduces the amount of data that need to be transmitted from the chip under test to the ATE. This invention also reduces the ATE occupation time and the required ATE capture memory space, and simplifies the analysis performed on the ATE. For a given target yield, the repair rate is improved and thus the size of the required spare elements is reduced.

The memory diagnosis and repair schemes of this invention comprises two major steps: (a) A fail-pattern identification and a syndrome-format structure are used to identify faulty rows, faulty columns and single faulty word in the memory during the testing process, then the syndrome information is generated and exported. (b) Based on the syndrome information, a redundancy analysis algorithm is applied and spare memory elements are allocated to repair the faulty memory cells.

In this invention, three kinds of fail-patterns are adopted. They are single-faulty-word, faulty-row, and faulty-column. Each fail-pattern has its own syndrome-format structure. In this invention, the flexibility of the spare elements is emphasized rather than the phase-2 RA algorithm. The method of this invention partitions a redundant row into several redundant words. The remaining faulty words after phase-1 can be repaired by spare words instead of spare rows, which increase redundancy utilization. Although the improved flexibility of spare elements increases the area of the BISR design, it increases the repair rate and thus reduces the size of required spare elements, for a given target yield. The repair rate is defined as the ratio of the number of repaired memories to the number of whole defective memories.

The BISD and the BISR designs of this invention have been demonstrated through hardware implementation. This hardware design integrates the BIRA, AR and BIST/D circuits of the present invention. It has a sequencer with enhanced fault syndrome identification, a BIRA with improved redundancy utilization, and an AR with reduced timing penalty during normal access.

The sequencer itself has a control module to enhance fail-pattern identification, whose function can be represented by the state diagram of an FSM. Because the spare-word repair scheme of this invention uses three types of redundancy, i.e., redundant rows, redundant columns, and redundant words, there are three types of storage element for address comparison in the AR design.

In the state diagram, the sequencer of this invention has eight states, more complex than the conventional design, to enhance fail-pattern identification. These states can be further grouped into three main categories: test execution states, fail-pattern identification states, and shift out state. The fail-pattern identification states include states of faulty row, pre_word test, next_word test, and faulty column.

Simulation results show that this invention effectively reduces the occupation time and the required capture memory space of the ATE, as compared to the conventional method. It also simplifies the analysis performed on the ATE. The BISD hardware overhead of this invention is low and decreases with increasing memory size. The gate count of the BISD design of this invention for an 8K×64 memory is 6569. In this case, an area overhead of 2.11% is obtained. The spare-word repair scheme of this invention is shown to increase the flexibility and utilization of the spare elements. Experimental results show that the spare-word repair scheme achieves a better repair rate with the same number of spare elements. The area overhead of the BISR scheme of this invention is low, e.g., only 8.9K gates (2.2%) for an 8K×64 memory core using a 0.25 um CMOS technology.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 5a shows a conventional fault syndrome.

FIG. 5b shows three kinds of fault syndromes according to the invention.

FIG. 11 shows a comparison of the compression ratios obtained with the method of the invention to those with a conventional method.

FIG. 12 shows the area overhead of the BISD design according to the invention.

FIG. 13 shows area overhead comparison of the BISR design according to the invention with four other BISR designs using different RA schemes.

DETAILED DESCRIPTION OF THE PREFERRED EMBODIMENTS

Figure 1:
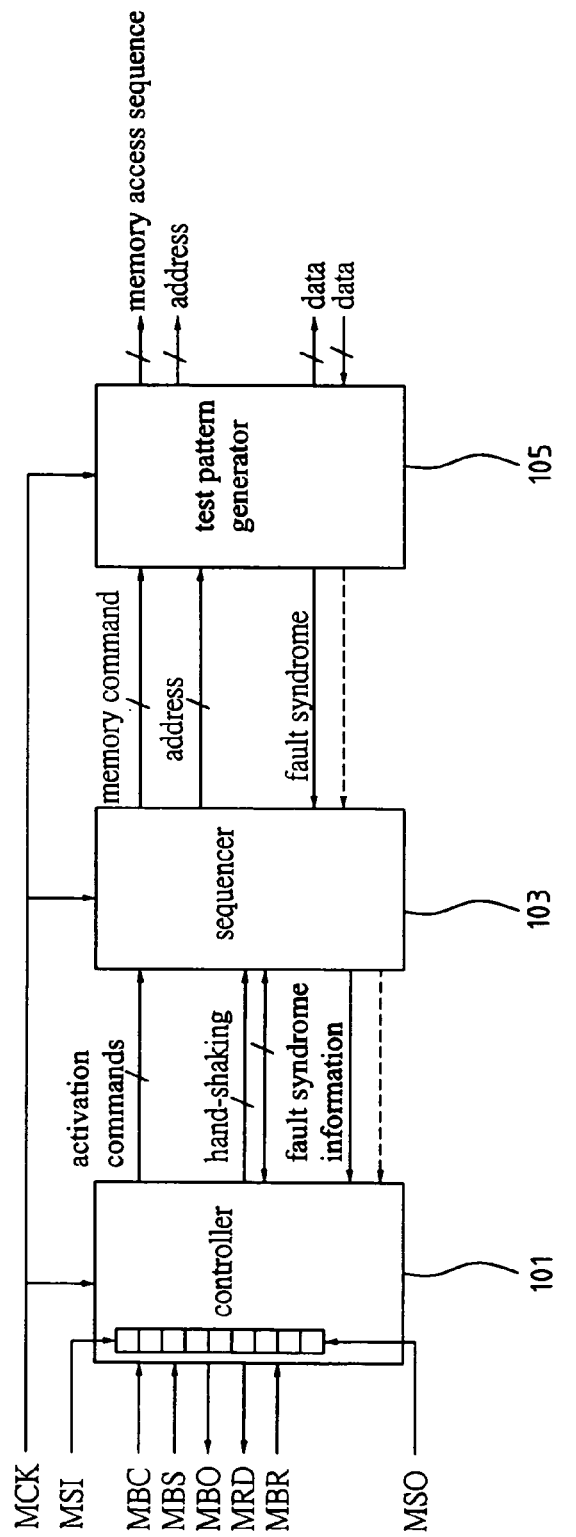
FIG. 1 shows a block diagram of a conventional BIST/BISD architecture.
Figure 2:
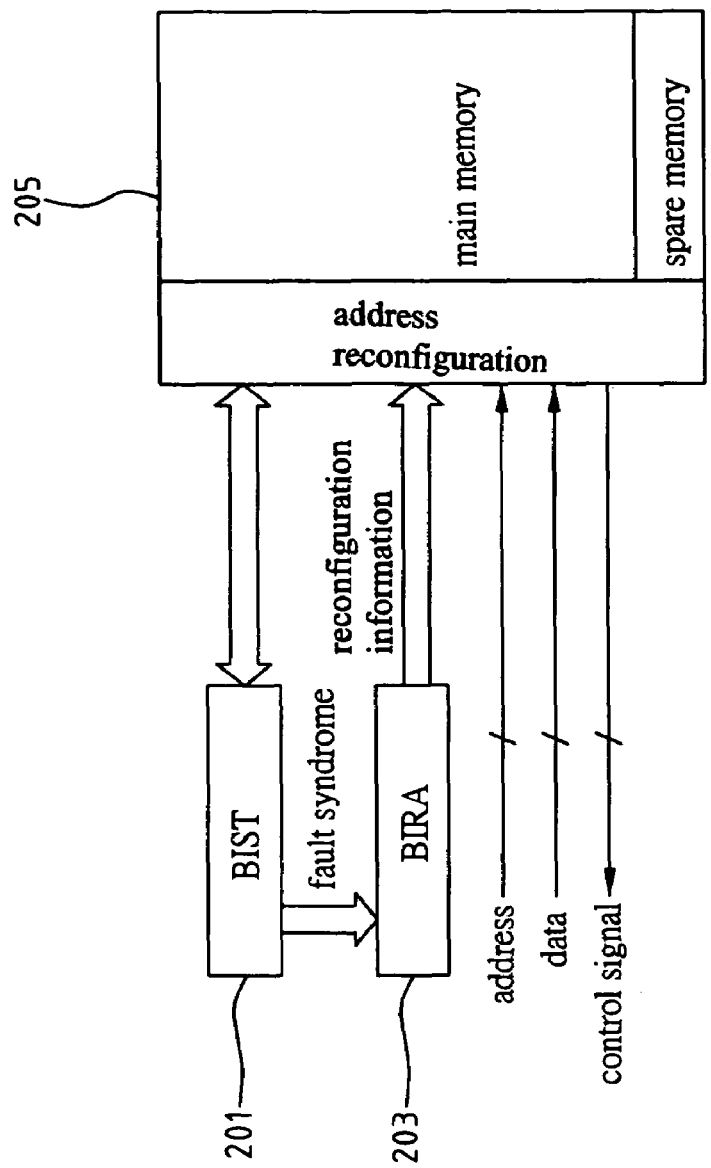
FIG. 2 shows a typical BISR design with three main blocks, BIST, BIRA, and AR.
Figure 3:
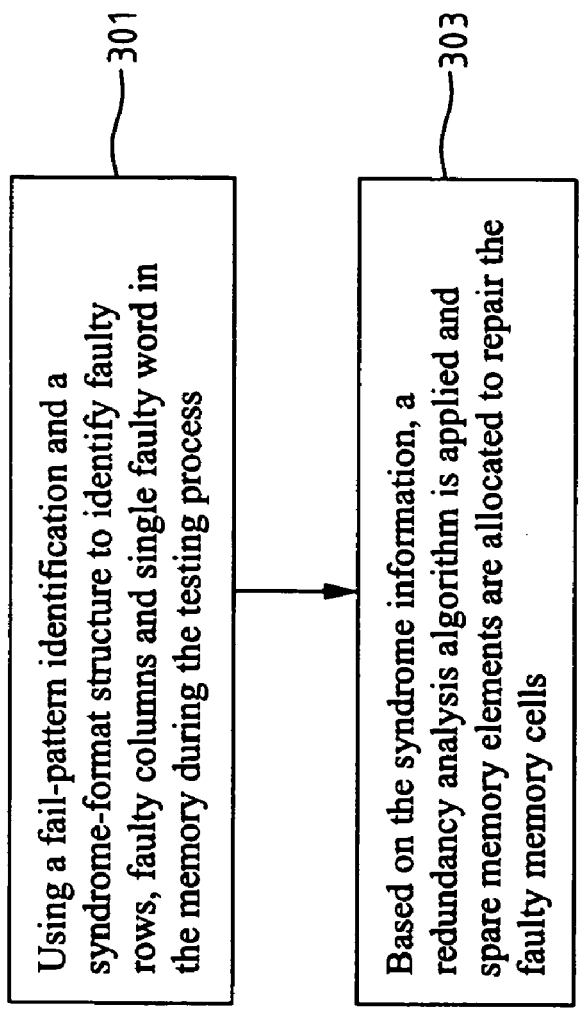
FIG. 3 shows a schematic diagram illustrating the method of BISD/R in a memory with syndrome identification according to the invention.

FIG. 3 depicts a schematic diagram illustrating the method of BISD/R in a memory with syndrome identification according to the invention. It comprises two major steps, 301 and 303. It uses a fail-pattern identification and a syndrome-format structure to identify faulty rows, faulty columns and single faulty word in the memory during the testing process, as shown in step 301. Then, the syndrome information is generated and exported. Based on the syndrome information, a redundancy analysis algorithm is applied and spare memory elements are allocated to repair the faulty memory cells, as shown in step 303.

Figure 4:
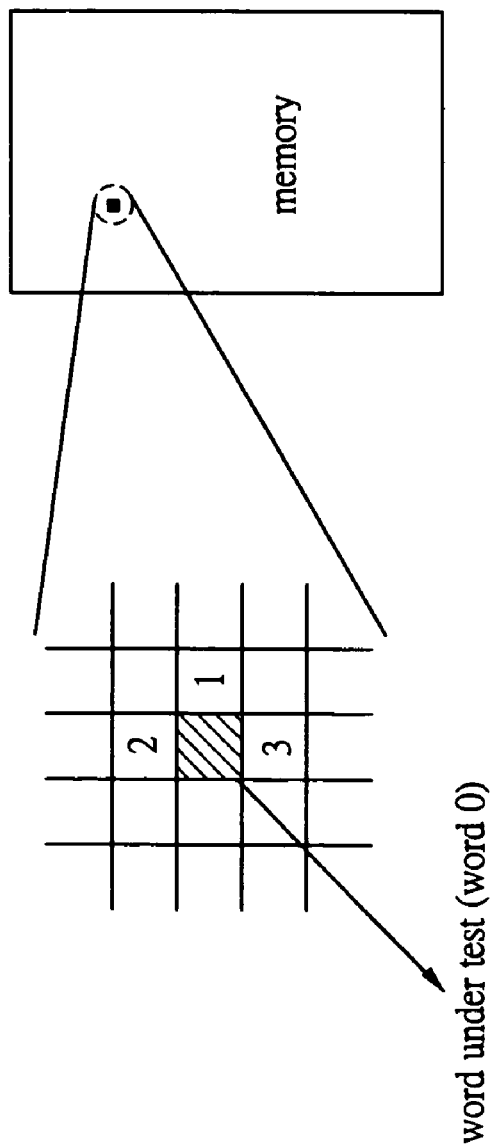
FIG. 4 shows a memory array under test, in which the shaded region in the left diagram represents the word under test.

The fail-pattern identification and the syndrome-format structure used in step 301 are further described in detail in the following. FIG. 4 shows a memory array under test. The shaded region in the left diagram is the word under test (WUT), representing word 0. The adjacent word 1 on the right is said to be in the same row as the word 0. The adjacent words 2 and 3, located above or under the word 0 respectively, are said to be in the same column as the word 0.

Based on the above definition, the faulty-row, faulty-column, and single word fault are identified by step 301 using the following criteria.

(a1) Faulty row: When word 0 is faulty, the next word in the same row (i.e., word 1) is tested. If word 1 is also faulty, the next word in the same row will be tested until a fault-free word or the end of the row is reached.

(a2) Faulty column: Identification of a faulty-column, assuming the word 0 has been tested faulty, consists of several condition-checking steps.

(a21) Word 1 is tested fault free, so a faulty-row can be excluded.

(a22) When the word above the word 0 in the same column (i.e., word 2) is tested fault free, all the words above the word 0 in the same column need not be tested.

(a23) When the word under the word 0 in the same column (i.e., word 3) is tested faulty, the next word in the same column will be tested until a fault-free word or the end of the column is reached.

(a3) Single faulty word: When word 0 is tested faulty but it is not in a faulty row or column (i.e., word 1, word 2, and word 3 are all tested fault-free), word 0 is considered as a single faulty-word.

As shown in FIG. 5*a*, the conventional syndrome is composed of three fields, session, address, and word syndrome. The session field records the read operation that detects the fault. For example, if there are five read operations, the session field will have three bits and the second read operation will have a session identifier (ID) of 001. Since the address field stores the address of the faulty word, its length is equal to the length of a normal word address.

The word syndrome field stores the Hamming syndrome of the faulty word at the current state, which represents the faulty cells in this word.

In the invention, three kinds of fail-patterns are adopted. They are single-faulty-word, faulty-row, and faulty-column. As shown in FIG. 5*b*, each fail-pattern has its own syndrome-format structure. They are single-faulty-word syndrome, faulty-row syndrome, and faulty-column syndrome.

According to the invention, the syndrome for single faulty word has four fields, syndrome ID, session, address, and compressed word syndrome, as shown in FIG. 5*b*. The syndrome IDs are used to distinguish the fail patterns: 00, 11, and 01 representing the single faulty word, faulty-row, and faulty-column, respectively. The compressed word syndrome is obtained from the original word syndrome, after compression by Huffman code. In general, the syndrome of a single faulty-word is shorter than the original syndrome because the Huffman-code compression is efficient for sparse Hamming syndromes.

The faulty-row syndrome is also composed of four fields, syndrome ID, session, address, and end column. Since the last faulty word has the same row address as the first faulty word, only the column address of the last faulty word (the end column field) has to be stored. The faulty-column syndrome is similar to the faulty-row syndrome, except that it has a compressed word syndrome field. Since all words are in the same column, only the row address of the last faulty word in the column is recorded in the end row field. Though the faulty-column syndrome may be longer than the original syndrome, it actually represents multiple faulty words in the same column and still has a high compression efficiency.

The compression ratio is defined as the ratio between the size of the compressed data and that of the original data. Assuming that S and W represent the lengths of a symbol (Huffman code word) and a memory word, respectively; Ns, Nr, and Nc denote the numbers of single faulty-words, faulty-rows, and faulty-columns, respectively; Ls, Lr, Lc, and Lo represent the lengths of the single-faulty-word syndrome, faulty-row syndrome, faulty-column syndrome, and original (uncompressed) syndrome, respectively; and Nf is the number of all faulty words in the memory, the compression ratio can be calculated as CR=(NsLs+NrLr+NcLc)/(NfLo). The defect distribution, which is not considered in this simple analysis, is known to affect the compression ratio. More accurate estimation of the compression ratio should be obtained by simulation.

As described earlier, a typical BISR design has three main blocks: BIST, BIRA, and AR. A conventional BIST/BISD architecture consists of three blocks, a controller, a sequencer and a TPG. The sequencer has a FSM, and is the main part of the BIST/D design. In the present invention, the BIRA, AR and BIST/D circuits are reconstructed and integrated to improve the diagnosis and the repair apparatus.

Figure 6:
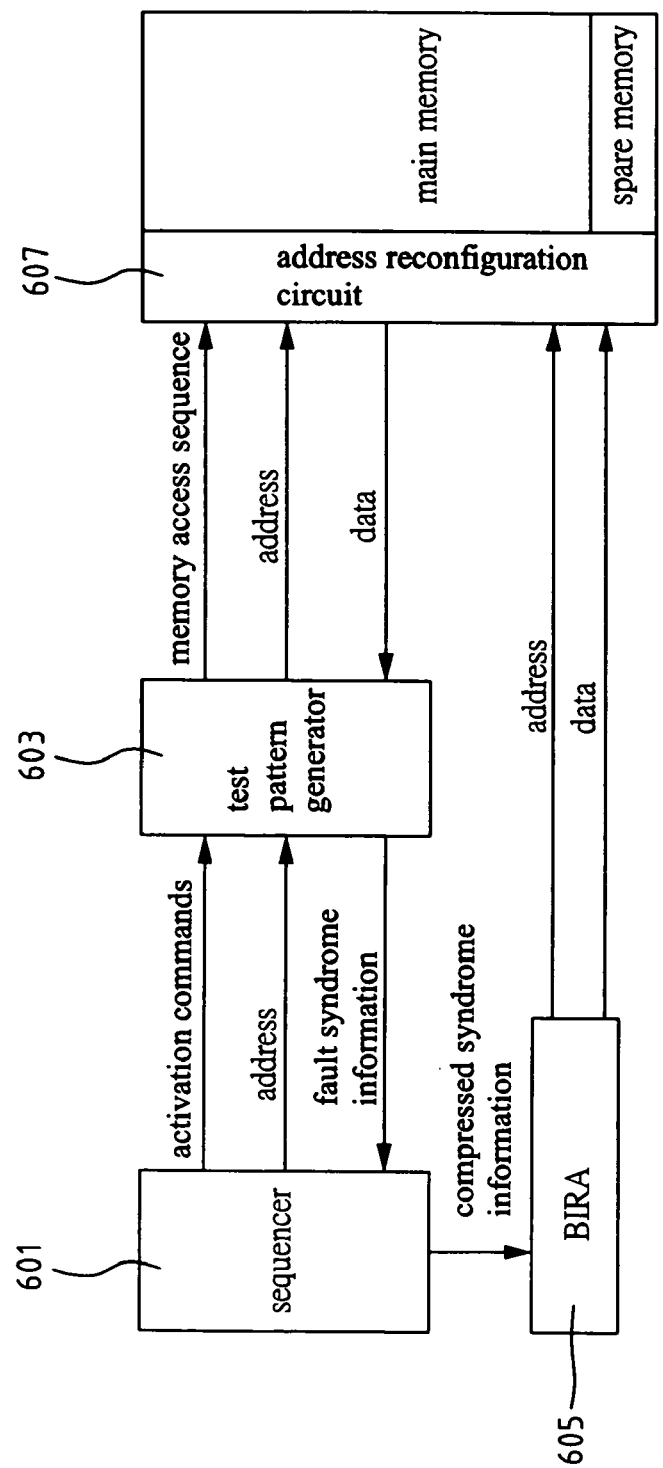
FIG. 6 shows the block diagram of the build-in self-diagnosis and repair apparatus according to the invention.

Accordingly, the build-in self-diagnosis and repair apparatus of this invention comprises a sequencer with enhanced faulty syndrome identification, a BIRA with improved redundancy utilization, and an AR circuit with reducing timing penalty during normal access. FIG. 6 shows the block diagram of the build-in self-diagnosis and repair apparatus according to the invention. The apparatus comprises a sequencer 601, a TPG 603, a BIRA 605, and an AR circuit 607.

The sequencer 601 receives coded data and activation commands, executes testing for a memory, and performs fault syndrome identification and syndrome compression. It also shifts out the compressed fault syndrome information to the BIRA 605, and generates test commands to TPG 603.

The TPG 603 decodes and executes the test commands sent from the sequencer 601. The fault syndrome information are collected by the TPG 603 and then forwarded to the sequencer 601 for analysis and compression. Based on the compressed fault syndrome, the BIRA 605 identifies the must-repair memory elements and the remaining faulty cells by using a built-in redundancy analysis (RA) algorithm. When a fault in the memory is detected, the AR circuit 607 performs the address reconfiguration for the memory to repair the must-repair elements and the remaining faulty cells.

In the sequencer, the function to enhance fail-pattern identification can be represented by the state diagram of an FSM. In the state diagram, the sequencer has eight states. These states can be further grouped into three main categories, test execution states, fail-pattern identification states, and a shift out state. The fail-pattern identification states include faulty row, pre_word test, next_word test, and faulty column.

Figure 7:
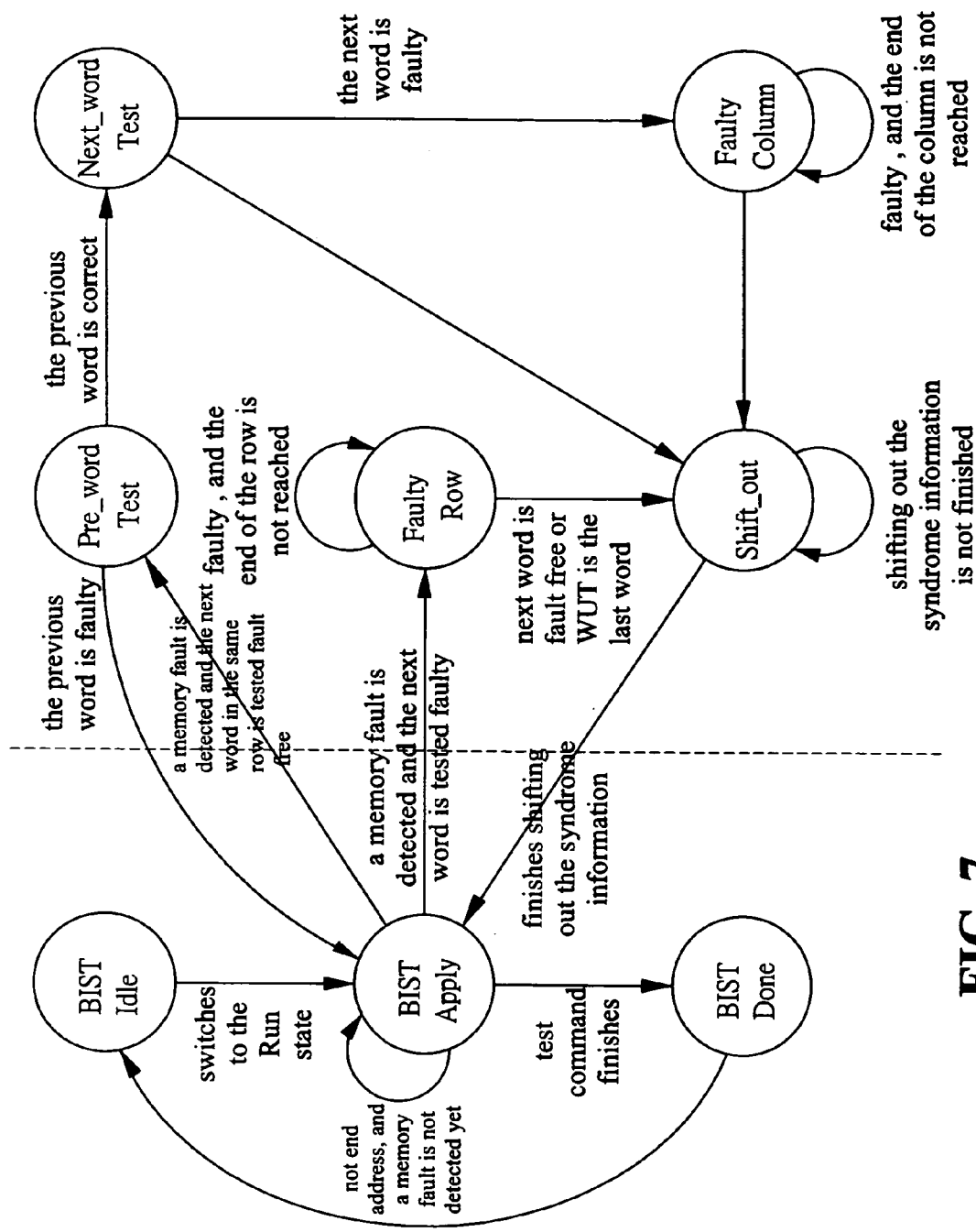
FIG. 7 shows the FSM in the sequencer according to the invention.

Referring to FIG. 7, the eight states are grouped and described in detail below.

(a) The test execution states is the conventional BIST design, and its functions are trivial. It has the following three states:
  (a1) BIST Idle: the initial state. It goes to BIST Apply when the controller switches to the Run state.
  (a2) BIST Apply: the test execution state. It executes the test command sent from the controller. If a memory fault is detected, it pauses and hands the control over to the fail-pattern identification states (described below).
  (a3) BIST Done: the terminating state. When the test command finishes, the sequencer goes to this state, and then goes back to BIST Idle and waits for the next test command.

(b) Fail-pattern identification states include the following four states:
  (b1) Faulty Row: when a memory fault is detected in the BIST Apply state, the sequencer circuit continues to test the next word in the same row, unless the end of the row is reached. When the next word is also faulty, it goes to the faulty row state, and stays there until a fault-free word appears or it reaches the end of the row. It then goes to the shift_out state for fault syndrome exporting.
  (b2) Pre_word Test: when a memory fault is detected in the BIST Apply state and the next word in the same row is tested fault free, it goes to the Pre_word test state. This state is used to confirm if the WUT is covered by the previous faulty-column pattern. If the previous word in the same column is faulty (with the same Word Syndrome), the WUT is covered by the previous faulty-column pattern and the sequencer goes back to the BIST Apply state without shifting out any data.
  (b3) Next_word test: if the previous word in the same column is correct or it has a different word syndrome from the WUT, the sequencer goes to the Next_word test state, unless the end of the column is reached. This state is used to test the next word in the same column.
  (b4) Faulty Column: in next_word test, if the next word is also faulty, it goes to the faulty Column state and continues to test subsequent words in the same column until a correct word is detected or it reaches the end of the column (in that case it goes to the shift_out state for fault syndrome exporting).

(c) Shift_out: in Next_word test, if the next word is fault free or the WUT is the last word in the column, the WUT is a single faulty-word, so the sequencer goes to the Shift_out state. It is used to shift out the syndromes. When the sequencer finishes shifting, it goes back to the BIST Apply state and the test process resumes.

If the memory is fault-free, the sequencer will only run in the test execution states, i.e., BIST Idle, BIST Apply, and BIST Done. It will then look like a typical BIST design, and in this case the testing time does not increase.

Figure 8:
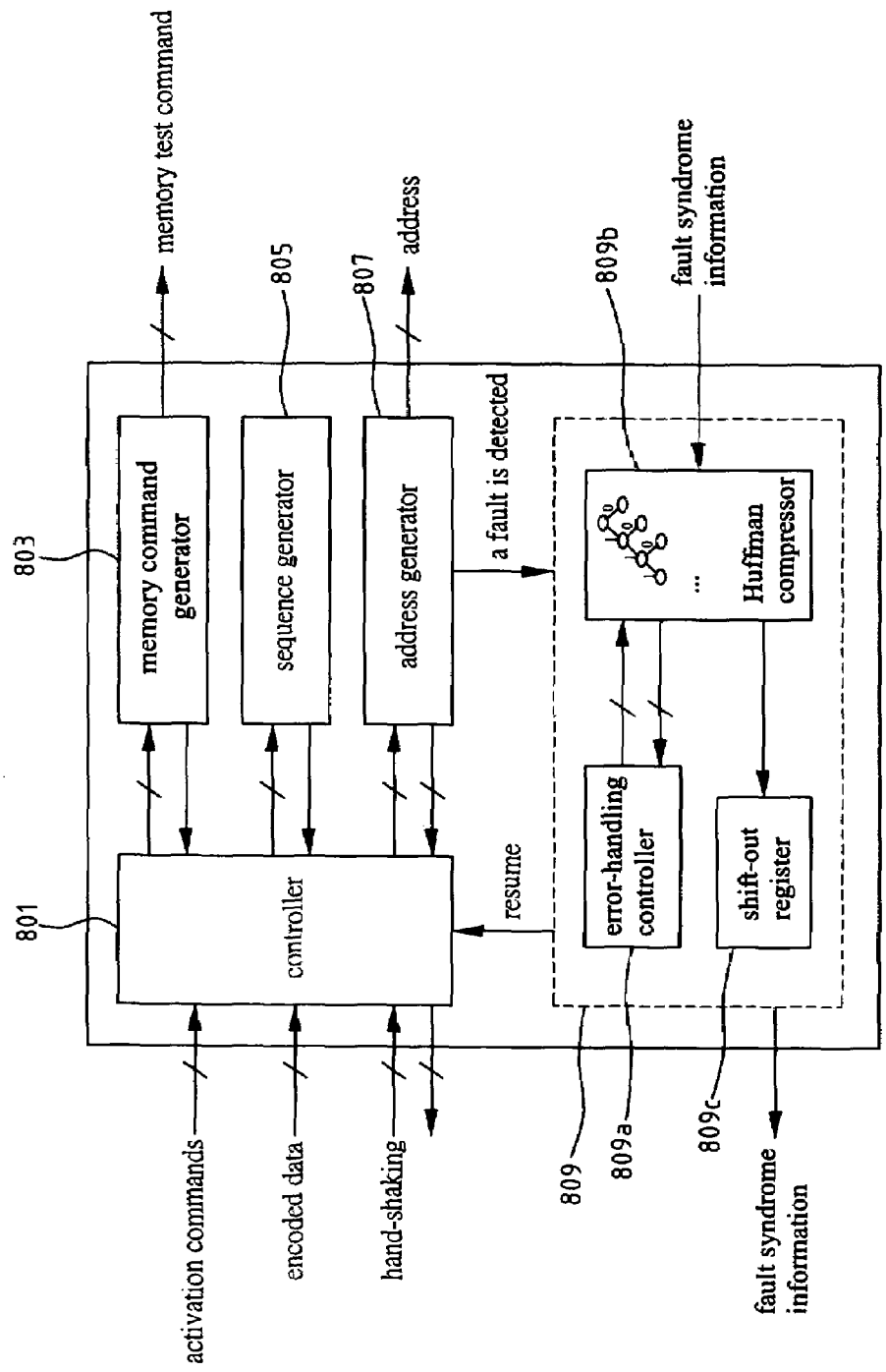
FIG. 8 shows the architecture of the sequencer according to the invention for enhancing fail-pattern identification.

FIG. 8 shows the architecture of the sequencer of this invention. It includes a control unit 801, a memory command generator 803, a sequence generator 805, an address generator 807, and a syndrome handling unit 809.

The control unit 801 is the interface between the sequencer and the external ATE (not shown in FIG. 8). It receives sequencer activation command and encoded data from the sequencer, and does the hand-shaking communication with the external ATE. The control unit 801 implements the FSM shown in FIG. 7. It controls the memory command generator 803, sequence generator 805, and address generator 807 to generate the test commands and address sequences defined by the test algorithm for the TPG (not shown in FIG. 8). The memory command generator 803 generates and outputs memory test commands. The address generator 807 generates and outputs memory address. The sequence generator 805 generates address sequences based on a predefined testing procedure to control the memory command generator 803 and the address generator 807, and inputs these address sequences to the control unit 801.

The syndrome handling unit 809 is composed of an error-handling controller 809a, a Huffman compressor 809b, and a shift-out register 809c. The shift-out register 809c is only active during the Shift-out state. The Huffman compressor 809b compresses the fault syndrome from the TPG, and it is implemented also by a FSM. It works during the fault syndrome shifting process.

During each clock cycle, the shift-out register 809c shifts out a bit of the fault syndrome to the external ATE, and the Huffman compressor 809b generates a bit of the Huffman code-word (i.e., the compressed syndrome) to the shift-out register 809c simultaneously. In this invention, the compression is done on-the-fly with the shifting process, so it does not need extra time. The area overhead of Huffman compressor 809b required for this scheme is less than that for building Huffman table scheme. The Huffman compressor 809b has about 100 logic gates In the present invention, the fail-pattern identification can be applied in the BISR design as well. This invention can implement the must-repair phase of redundancy analysis. The flexibility of the spare elements is emphasized in this invention rather than the phase-2 RA algorithms. This invention partitions a spare row into several spare words. The remaining faulty words after phase-1 can be repaired by spare words (spare-word repair scheme) instead of spare rows, which increases redundancy utilization. When faults in the memory array are detected, the BIRA and the AR modules perform the analysis and address reconfiguration, respectively. This spare-word repair scheme can be represented by the state diagram shown in FIG. 9.

Figure 9:
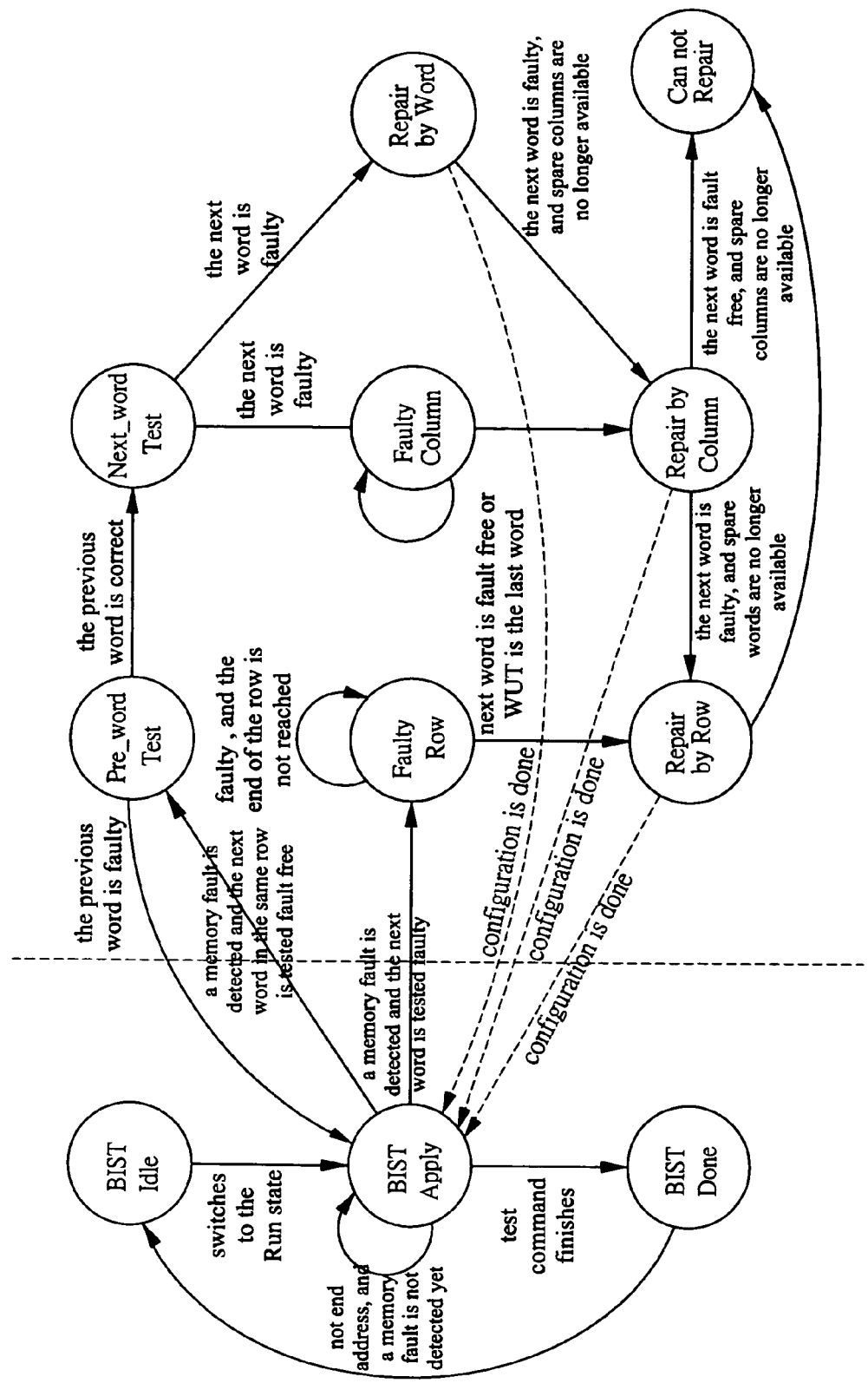
FIG. 9 shows the state diagram of the spare-word repair scheme performed by the FSM in the sequencer according to the invention.

According to this invention, a sequencer with spare-word repair scheme has eleven states as shown in FIG. 9. Some states of the BISR design are similar to the BISD design in this invention, i.e., test execution states and fail-pattern identification states. The shift out state is replaced by address reconfiguration states which are Repair by Word state, Repair by Column state, Repair by Row state, and Can not Repair state. These address reconfiguration states are used to repair the faulty cell with more suitable redundancy, and thus the utilization of the spare elements is improved.

These address reconfiguration states are described in detail herein below.

(a) Repair by Word: in Next_word Test state, if the next word is correct, the WUT is a single word fault and the sequencer switches to the Repair by Word state, where the WUT is repaired by a spare word. After that, it goes to the BISTAapply state and resumes the test process (dashed line in FIG. 9). If spare words are no longer available, it goes to Repair by Column state.

(b) Repair by Column: in this state, it needs to check a flag first. This flag is used to indicate whether the current state has been reached from the faulty column state or repair by word state. If it is reached from Faulty Column state and spare columns are no longer available, it goes to Can not Repair state. If it is reached from Repair by Word state and spare columns are no longer available, it goes to Repair by Row state. After the faulty column or word is repaired, it returns to BIST Apply state and resumes the testing process.

(c) Repair by Row: the state repairs the faulty row or single word fault with a spare row. If there is no available spare row, it goes to Can not Repair state, else it returns to BIST Apply state and resumes the testing process.

(d) Can not Repair: when the fault cannot be repaired, it goes to this state, and generates the "no go" output.

Figure 10:
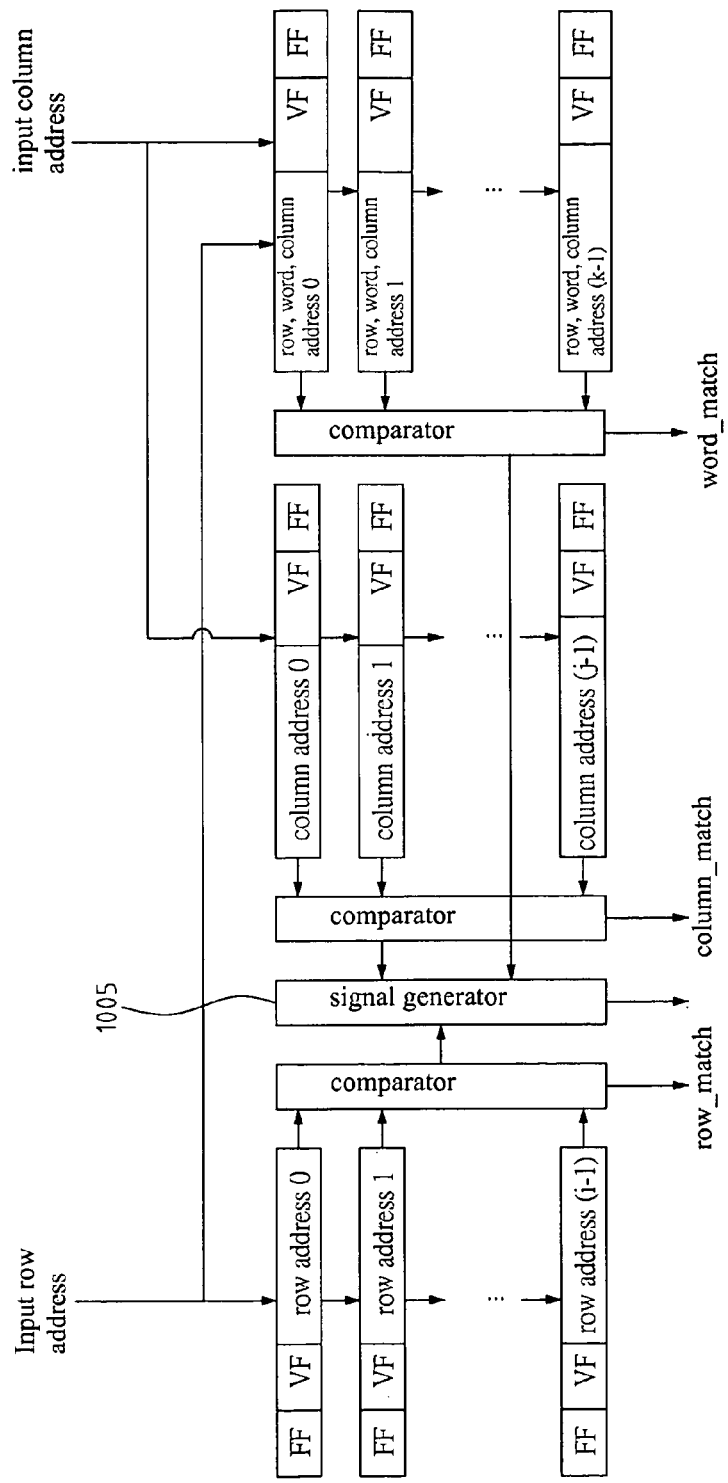
FIG. 10 shows a circuit diagram of the AR design according to the invention.

The AR circuit is another important component of BISR design. FIG. 10 shows the AR circuit of BISR design, which mainly contains a plurality of storage elements (registers), a plurality of comparators, and a signal generator. Each storage element stores the information of a faulty cell.

Since the spare-word repair scheme uses three types of redundancy, i.e., spare rows, spare columns, and spare words, there are three types of storage element for comparing row address, column address and word address, respectively in the AR circuit. Each storage element has two flags: 1) the fault flag (FF) presents whether the corresponding spare element is defective or fault-free; 2) the valid flag (VF) indicates whether the stored fault address is valid or not. The FF is used to mark faulty spare elements, if a spare element is faulty under spare memory testing, the FF sets to high. The VF flag indicates the validity of the address stored in the storage element.

In normal access mode, the addresses stored in the storage elements are compared with required/access address concurrently. Therefore, it reduces the address comparison time. If the access address hits the stored address (i.e., the access word is faulty), the signal generator 1005 generates a signal to remap the address to spare elements. In the test/repair mode, when a new fault address is received, the AR circuit compares it with all the stored addresses with FF=0 and VF=1. If there is no match, that means the address is a new one, the received address is stored in the storage elements. The storage element allocated to the new fault address must be a fault-free unused one with FF=0 and VF=0.

According to the BISD design of this invention, the length of the Huffman symbol affects the syndrome compression ratio, so do the defect distribution, fail pattern distribution, etc. To evaluate these effects and the required area overhead for the BISD design and for different RA schemes, detailed simulations have been performed and some results are presented herein below.

FIG. 11 shows a comparison of the compression ratios obtained with the method of this invention to those with the conventional method. According to FIG. 11, the compression method of this invention greatly improves the compression ratio as compared to the conventional method, except that there are only single faulty-words. In FIG. 11, r and c represent the weights (percentages) of the faulty-rows and faulty-columns, respectively. For example, if both r and c are equal to 10%, then the probabilities that a defect located at a faulty-row, a faulty-column, and a faulty-word are 10%, 10%, and 80%, respectively. The method used in this invention is especially efficient for faulty-columns. This can be seen in FIG. 11 when c equals to 60% or 40%. If there are only single faulty-words, the CR of this invention is slightly higher than that of conventional method. However, the CR of this invention is lower than 6% in most cases because faulty rows or/and columns often exist. In these cases, the data is compressed to less than 6% of its original size. As the number of faulty rows/columns increases, the CR of this invention decreases.

The area overhead of the BISD design proposed in this invention is low, as shown in FIG. 12. The percentage of the area overhead decreases with increasing memory size. For example, the gate count of a BISD design for an 8K×64 memory is 6569, and the area overhead is only 2.11%.

FIG. 13 shows the area overhead comparison of the BISR design of this invention with four other BISR designs for a main memory size of 8K×64. The four other BISR designs with different phase-2 RA schemes include row-first, column-first, small-bitmap, and a self-repair scheme published in "A build-in self-repair scheme for semiconductor memories with 2-D redundancy" by J. F. Li and others in 2003. The comparison is done under a similar repair rate and hardware implementation constraints.

As described earlier, the spare-word repair scheme of this invention has a higher repair rate than other phase-2 RA algorithms with the same spare elements. If the redundancy of this scheme consists of four spare rows and four spare columns, the said other four schemes require more redundancy, i.e., four spare rows and eight spare columns. Note that the area of the extra four spare columns is larger than that of 4.5K logic gates.

If the area of the spare elements is not considered, the BISR design with the row-first scheme or column-first scheme has the lowest area overhead of 4.8K logic gates. The small-bitmap scheme has the highest BISR area overhead of 7.6K logic gates. If the area of the spare elements is included, the spare-word repair scheme of this invention has the lowest BISR area overhead, which is only 2.2% for an 8K×64 memory array.

In summary, this invention provides an efficient memory diagnosis and repair method and apparatus based on fail-pattern identification. The diagnosis scheme of this invention can distinguish faulty-row, faulty-column, and single word fault. In this invention, the Huffman compression method is applied in the fault syndrome compression. Therefore, the amount of the data transmitted from the chip under test to automatic test equipment is significantly reduced without losing fault information. The BISR scheme of this invention can implement the must-repair phase by the fail-pattern identification, and then more flexible RA scheme and efficient spare-word repair scheme are applied to replace the faulty cells with spare memories. This invention uses fewer spare elements than other redundancy analysis schemes under the same repair rate. The experimental results show that the area overhead of the BISD and the BISR designs of this invention is only 2.11% and 2.2%, respectively, for an 8K×64 memory.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of build-in self-diagnosis and repair in a memory with syndrome identification, comprising the steps of:
   (a) using a fail-pattern identification and a syndrome-format structure to identify faulty rows, faulty columns and single faulty words in the memory during a memory testing, then generating and exporting fault syndrome information associated with said faulty rows, said faulty columns and said single faulty words; and
   (b) according to said fault syndrome information, using a redundancy analysis algorithm to allocate spare memory elements for repairing faulty cells in the memory;
   wherein said syndrome-format structure includes faulty-row-syndrome format, faulty-column-syndrome format, and single-faulty-word-syndrome format.

2. The method of build-in self-diagnosis and repair in a memory with syndrome identification as claimed in claim 1, wherein said fail-pattern identification in step (a) uses three kinds of fail-patterns, and each fail-pattern has its own syndrome-format structure.

3. The method of build-in self-diagnosis and repair in a memory with syndrome identification as claimed in claim 1, wherein said step (a) is performed according to the following criteria:
   (a1) when a faulty word in a row is identified, the word immediately adjacent to said faulty word in said row is tested, and if the adjacent word is also faulty, a next adjacent word in said row is tested until a fault-free word or the end of said row is reached and said row is referred to as a faulty row;
   (a2) identification of a faulty column using the following three condition-checking steps:
      (a21) the word adjacent to said faulty word in said row is tested fault free, and said row is excluded from being a faulty row,
      (a22) when the word immediately above said faulty word in a same column of said faulty word is tested fault free, all the words above said faulty word in the same column are excluded from further testing, and
      (a23) when the word immediately under said faulty word in the same column is tested faulty, a next adjacent word in the same column is tested until a fault-free word or the end of the same column is reached and the same column is referred to as a faulty column; and
   (a3) when a word is tested faulty but is not part of a faulty row or faulty column, it is referred to as a single faulty-word.

4. The method of build-in self-diagnosis and repair in a memory with syndrome identification as claimed in claim 1, wherein said faulty-row syndrome format includes a syndrome identifier field for storing a faulty-row pattern, a session field for storing a read operation that detects a faulty word in a faulty row, an address field for storing the address of the faulty word, and an end column field for storing the column address of a last faulty word in the faulty row.

5. The method of build-in self-diagnosis and repair in a memory with syndrome identification as claimed in claim 1, wherein said faulty-column syndrome format includes a syndrome identifier field for storing a faulty-column pattern, a session field for storing a read operation that detects a faulty word in a faulty column, an address field for storing the address of the faulty word, an end row field for storing the row address of a last faulty word in the faulty column, and a compressed word syndrome field for storing a compressed word syndrome of an original word syndrome.

6. The method of build-in self-diagnosis and repair in a memory with syndrome identification as claimed in claim 1, wherein said single-faulty-word-syndrome format includes a syndrome identifier field for storing a single-faulty-word pattern, a session field for storing a read operation that detects a single faulty word, an address field for storing the address of the single fault word, and a compressed word syndrome field for storing a compressed word syndrome of an original word syndrome.

7. The method of build-in self-diagnosis and repair in a memory with syndrome identification as claimed in claim 1, wherein said redundancy analysis algorithm in said step (b) includes a must-repair phase and a remaining-faulty-word-repair phase, wherein a spare-word repair method is adopted in a redundancy structure in said remaining-faulty-word-repair phase, and said redundancy structure includes three types of redundancy repair, said three types of redundancy repair are repair-by-row, repair-by-column, and repair-by-word.

8. The method of build-in self-diagnosis and repair in a memory with syndrome identification as claimed in claim 7, wherein said repair-by-word is performed by repairing a faulty word with a spare word, and said repair-by-row is performed by repairing a faulty row with a spare row, and said repair-by-column is performed by repairing a faulty column with a spare column.

9. A method of build-in self-diagnosis and repair in a memory with syndrome identification, comprising the steps of:
   (a) using a fail-pattern identification and a syndrome-format structure to identify faulty rows, faulty columns and single faulty words in said memory during a memory testing, then generating and exporting fault syndrome information associated with said faulty rows, said faulty columns and said single faulty words; and
   (b) according to said fault syndrome information, using a redundancy analysis algorithm to allocate spare memory elements for repairing faulty cells in the memory;
   wherein said step (a) is performed according to the following criteria:
   (a1) when a faulty word in a row is identified, the word immediately adjacent to said faulty word in said row is tested, and if the adjacent word is also faulty, a next adjacent word in said row is tested until a fault-free word or the end of said row is reached and said row is referred to as a faulty row;
   (a2) identification of a faulty column using the following three condition-checking steps:
      (a21) the word adjacent to said faulty word in said row is tested fault free, and said row is excluded from being a faulty row,
      (a22) when the word immediately above said faulty word in a same column of said faulty word is tested fault free, all the words above said faulty word in the same column are excluded from further testing,
      (a23) when the word immediately under said faulty word in the same column is tested faulty, a next adjacent word in the same column is tested until a fault-free word or the end of the same column is reached and the same column is referred to as a faulty column; and (a3) when a word is tested faulty but is not part of a faulty row or faulty column, it is referred to as a single faulty-word.

10. An apparatus of build-in self-diagnosis and repair in a memory with syndrome identification, comprising:
a build-in self test circuit;
a build-in redundancy analysis circuit; and
an address reconfiguration circuit;
wherein a fail pattern identification and a syndrome-format structure are implemented to identify and repair faulty rows, faulty columns and single faulty words in said memory during a memory testing, said syndrome-format structure including faulty-row-syndrome format, faulty-column-syndrome format, and single-faulty-word-syndrome format.

11. The apparatus of build-in self-diagnosis and repair in a memory with syndrome identification as claimed in claim 10, said build-in self test circuit further comprising:
a sequencer for receiving encoded data and activation commands to perform test commands and syndrome identification for said memory, compressing fault syndrome information, and shifting out compressed fault syndrome information during said memory testing; and
a test pattern generator for decoding said test commands from said sequencer and forwarding said fault syndrome information to said sequencer for analysis and compression;
wherein said build-in redundancy analysis circuit performs redundancy analysis and spare elements configuration according to said compressed fault syndrome information and a build-in redundancy analysis algorithm, and said address reconfiguration circuit performs address reconfiguration when a fault in said memory is detected, and repairs faulty memory cells.

12. The apparatus of build-in self-diagnosis and repair in a memory with syndrome identification as claimed in claim 11, said sequencer further comprising:
a controller for receiving said encoded data and said activation commands, executing said test commands and said syndrome identification for said memory, and hand-shaking with an external automatic test equipment;
a memory command generator for generating and outputting memory test commands;
an address generator for generating and outputting address of said memory;
a sequence generator for generating a sequence order based on a predefined testing procedure to control the output of said memory command generator and said address generator; and
a syndrome handling unit for receiving, compressing said fault syndrome information and then shifting out said compressed fault syndrome information.

13. The apparatus of build-in self-diagnosis and repair in a memory with syndrome identification as claimed in claim 12, wherein said syndrome handling unit comprises an error-handling controller, a Huffman compressor for compressing said fault syndrome information to a Huffman code-word, and a shift-out register.

14. The apparatus of build-in self-diagnosis and repair in a memory with syndrome identification as claimed in claim 13, wherein said shift-out register shifts out a bit of said compressed fault syndrome information to said external automatic test equipment and said Huffman compressor generates a bit of said Huffman code-word to said shift-out register simultaneously in a clock cycle.

15. The apparatus of build-in self-diagnosis and repair in a memory with syndrome identification as claimed in claim 10, wherein said build-in-redundancy-analysis circuit is implemented by a finite state machine which has a state diagram including test execution state, fail-pattern identification state, and address reconfiguration state.

16. The apparatus of build-in self-diagnosis and repair in a memory with syndrome identification as claimed in claim 10, wherein said address reconfiguration circuit comprises plural storage elements, plural comparators, and a signal generator, and each of said storage elements stores the information of a faulty cell.

17. The apparatus of build-in self-diagnosis and repair in a memory with syndrome identification as claimed in claim 16, wherein said address reconfiguration circuit has three types of storage elements for address comparison, and said three types of storage elements store row address, column address, and word address.

18. The apparatus of build-in self-diagnosis and repair in a memory with syndrome identification as claimed in claim 16, wherein each of said storage element includes two flags and one memory cell address.

19. The apparatus of build-in self-diagnosis and repair in a memory with syndrome identification as claimed in claim 18, wherein said two flags are defective flag and valid flag, and said memory cell address is row address or column address or word address, and said defective flag presents whether a corresponding spare element is defective or fault-free, and said valid flag indicates whether a stored fault address is valid or invalid.

* * * * *